United States Patent
Donovan et al.

(10) Patent No.: US 8,913,973 B2
(45) Date of Patent: Dec. 16, 2014

(54) METHODS FOR DETERMINING OPTIMUM POWER SUPPLY VOLTAGES FOR RADIO-FREQUENCY POWER AMPLIFIER CIRCUITRY

(71) Applicant: Apple Inc., Cupertino, CA (US)

(72) Inventors: David A. Donovan, Oakland, CA (US); Justin Gregg, San Francisco, CA (US); Vishuanath Venkataraman, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 48 days.

(21) Appl. No.: 13/673,829

(22) Filed: Nov. 9, 2012

(65) Prior Publication Data

US 2013/0072129 A1 Mar. 21, 2013

Related U.S. Application Data

(62) Division of application No. 12/761,219, filed on Apr. 15, 2010, now Pat. No. 8,583,062.

(51) Int. Cl.
| | |
|---|---|
| *H03F 3/24* | (2006.01) |
| *H03F 1/02* | (2006.01) |
| *H03F 3/189* | (2006.01) |

(52) U.S. Cl.
CPC ............ *H03F 3/24* (2013.01); *H03F 1/0216* (2013.01); *H03F 3/189* (2013.01); *H03F 2200/27* (2013.01); *H03F 2200/451* (2013.01); *H03F 2200/504* (2013.01)
USPC ................................ 455/127.1; 455/115.1

(58) Field of Classification Search
CPC ......... H03F 1/02; H03F 1/216; H03F 1/0233; H03F 1/0211; H04B 1/0475
USPC ............... 455/572, 574, 67.11, 115.1, 127.1, 455/127.5
See application file for complete search history.

(56) References Cited

U.S. PATENT DOCUMENTS

| | | | |
|---|---|---|---|
| 6,008,698 A | 12/1999 | Dacus et al. | |
| 6,178,313 B1 | 1/2001 | Mages et al. | |

(Continued)

FOREIGN PATENT DOCUMENTS

| | | |
|---|---|---|
| EP | 1569330 | 8/2005 |
| EP | 1601096 | 11/2005 |

(Continued)

OTHER PUBLICATIONS

Dimpflmaier et al., U.S. Appl. No. 12/465,260, filed May 13, 2009.

(Continued)

*Primary Examiner* — Blane J Jackson
(74) *Attorney, Agent, or Firm* — Treyz Law Group; Jason Tsai (57) ABSTRACT

Electronic devices with wireless communications capabilities are provided. The electronic device may include storage and processing circuitry, power amplifier circuitry, power supply circuitry, etc. The storage and processing circuitry may direct the power amplifier circuitry to operate using a desired gain mode, in a particular radio channel, and at a given output power level. The power supply circuitry may bias the power amplifier circuitry with a power supply voltage. The performance of the power amplifier circuitry may be characterized by an adjacent channel leakage ratio (ACLR) margin. The power consumption of the power amplifier circuitry may be characterized by a current savings ratio. A cost function may be calculated by taking the product of the ACLR margin and current savings ratio. A minimum point for each cost function curve may be determined. It is desirable to bias the power amplifier circuitry with a supply voltage corresponding to the minimum point.

23 Claims, 7 Drawing Sheets

(56) References Cited

U.S. PATENT DOCUMENTS

| | | |
|---|---|---|
| 6,323,729 B1 | 11/2001 | Sevenhans et al. |
| 6,725,021 B1 | 4/2004 | Anderson et al. |
| 7,378,909 B2 | 5/2008 | Tomizawa |
| 7,474,149 B2 | 1/2009 | Snelgrove et al. |
| 8,306,490 B2 | 11/2012 | Tanoue et al. |
| 8,331,883 B2 | 12/2012 | Sorensen et al. |
| 2004/0021516 A1 | 2/2004 | Oishi et al. |
| 2005/0110562 A1 | 5/2005 | Robinson et al. |
| 2006/0068830 A1 | 3/2006 | Klomsdorf |
| 2006/0084398 A1 | 4/2006 | Chmiel et al. |
| 2006/0114075 A1 | 6/2006 | Janosevic et al. |
| 2006/0160503 A1 | 7/2006 | Ichitsubo et al. |
| 2008/0171523 A1 | 7/2008 | Anderson et al. |
| 2009/0039960 A1 | 2/2009 | Park et al. |
| 2009/0270137 A1 | 10/2009 | Sorensen et al. |
| 2010/0112967 A1 | 5/2010 | Sorensen et al. |
| 2010/0291975 A1 | 11/2010 | Dimpflmaier et al. |
| 2011/0285461 A1 | 11/2011 | Heo et al. |

FOREIGN PATENT DOCUMENTS

| | | | |
|---|---|---|---|
| EP | 1601096 A1 * | 11/2005 | ............... H03F 1/02 |
| TW | 200737701 | 10/2007 | |

OTHER PUBLICATIONS

Donovan et al., U.S. Appl. No. 12/625,534, filed Nov. 24, 2009.
Sorensen, U.S. Appl. No. 12/262,121, filed Oct. 30, 2008.
Sorensen et al., U.S. Appl. No. 12/110,260, filed Apr. 25, 2008.
Dimpflmaier et al., U.S. Appl. No. 12/633,530, filed Dec. 8, 2009.

* cited by examiner

METHODS FOR DETERMINING OPTIMUM POWER SUPPLY VOLTAGES FOR RADIO-FREQUENCY POWER AMPLIFIER CIRCUITRY

This application is a division of patent application Ser. No. 12/761,219, filed Apr. 15, 2010, which is hereby incorporated by referenced herein in its entirety. This application claims the benefit of and claims priority to patent application Ser. No. 12/761,219, filed Apr. 15, 2010.

BACKGROUND

This invention relates generally to wireless communications circuitry, and more particularly, to ways in which to optimize wireless communications performance by making power amplifier bias adjustments.

Integrated circuits often have wireless communications circuitry that includes radio-frequency power amplifiers. Radio-frequency power amplifiers are used to amplify radio-frequency signals for wireless transmission in a desired channel.

Radio-frequency power amplifiers typically exhibit reduced power consumption at lower supply voltages. Lowering the supply voltage that biases the power amplifiers directly decreases the supply current that flows through the radio-frequency power amplifiers, thereby saving power. Lowering the supply voltage, however, degrades power amplifier linearity. Degrading power amplifier linearity in this way may undesirably increase adjacent channel leakage ratio (e.g., the ratio of out-of-channel power to in-channel power).

It would therefore be desirable to be able to provide a method for determining an optimum supply voltage level to bias the radio-frequency power amplifiers to balance enhanced linearity with reduced power consumption.

SUMMARY

Electronic devices may include wireless communications circuitry. The wireless communications circuitry may include storage and processing circuitry, radio-frequency input-output circuits, radio-frequency power amplifier circuitry, adjustable power supply circuitry, and other wireless circuits.

The radio-frequency input-output circuits may feed signals to the power amplifier circuitry. The power amplifier circuitry may amplify the signals prior to wireless transmission. The power amplifier circuitry may include multiple power amplifier stages. The storage and processing circuitry may control these stages to place the power amplifier circuitry in a desired gain mode. For example, the power amplifier may be placed into a high gain mode by enabling all of the power amplifier stages or may be placed into a low gain mode by enabling one of the power amplifier stages.

The storage and processing circuitry may bias the power amplifier circuitry at a desired positive power supply voltage. The power supply voltage may be supplied to each of the power amplifier stages. Adjustments to amplifier bias may be made to ensure adequate performance while minimizing power consumption.

The performance of the power amplifier circuitry may be characterized by a metric such as an adjacent channel leakage ratio (ACLR). The adjacent channel leakage ratio in a system is defined as the ratio of out-of-channel power to in-channel power. A small adjacent channel leakage ratio value is indicative of good amplifier linearity. ACLR margin may sometimes be used to quantify power amplifier circuitry performance. ACLR margin may be calculated by subtracting a measured ACLR from a target ACLR. ACLR margin may generally rise as supply voltage increases, reflecting improved amplifier linearity at elevated amplifier bias voltages.

During device characterization operations, the amount of supply current used by the power amplifier circuitry may be measured. Supply current will generally rise as supply voltage increases. Lower supply currents are desirable for lower power consumption. A current savings ratio may be determined by subtracting the maximum supply current from measured supply current and then dividing that difference by the maximum supply current. The maximum supply current is the maximum amount of current that is fed to the power amplifier circuitry when operating at its maximum supply voltage. A lower (i.e., more negative) current savings ratio may be desirable for improved power savings.

A cost function may be calculated by taking the product of the ACLR margin and the current savings ratio. Each factor may be raised to a desired exponent to provide a suitable weighting scheme. For example, the ACLR margin may be squared to place emphasis on amplifier linearity.

An electronic device may be tested at each operating point (e.g., in a desired gain mode, output power level, supply voltage level, frequency range, etc.) to obtain a set of cost function characteristic curves. Test equipment may be used to determine the minimum point on each cost function curve. The power supply voltage corresponding to the minimum point corresponds to an optimum supply voltage level for use by the device during normal operation. This optimum voltage biases the power amplifier circuitry so as to provide a desired balance between amplifier linearity and power consumption.

Further features of the present invention, its nature and various advantages will be more apparent from the accompanying drawings and the following detailed description.

DETAILED DESCRIPTION

This relates generally to wireless communications, and more particularly, to biasing wireless communications circuitry at optimum supply voltage levels in wireless electronic devices.

The wireless electronic devices that are biased in this way may be portable electronic devices such as laptop computers or small portable computers of the type that are sometimes referred to as ultraportables. Portable electronic devices may also be somewhat smaller devices. The wireless electronic devices may be, for example, cellular telephones, media players with wireless communications capabilities, handheld computers (also sometimes called personal digital assistants), remote controllers, global positioning system (GPS) devices, and handheld gaming devices. Wireless electronic devices such as these may perform multiple functions. For example, a cellular telephone may include media player functionality and may have the ability to run games, email applications, web browsing applications, and other software.

Figure 1:
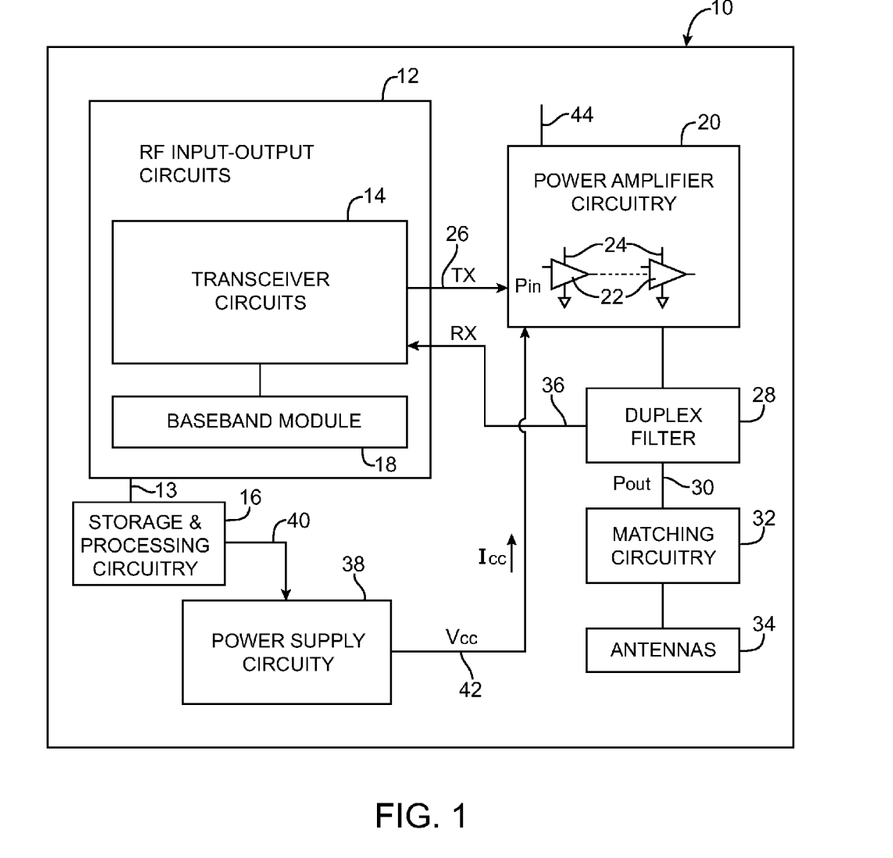
FIG. 1 is a diagram of an illustrative electronic device with wireless communications circuitry in accordance with an embodiment of the present invention.

An illustrative electronic device that includes wireless communications circuitry is shown in FIG. 1. As shown in FIG. 1, device 10 may include one or more antennas such as antennas (antenna structures) 34 and may include radio-frequency (RF) input-output circuits 12. During signal transmission operations, circuitry 12 may supply radio-frequency signals that are transmitted by antennas 34. During signal reception operations, circuitry 12 may accept radio-frequency signals that have been received by antennas 34.

The antenna structures and wireless communications circuitry of device 10 may support communications over any suitable wireless communications bands. For example, the wireless communications circuitry may be used to cover communications frequency bands such as cellular telephone voice and data bands at 850 MHz, 900 MHz, 1800 MHz, 1900 MHz, and the communications band at 2100 MHz band, the Wi-Fi® (IEEE 802.11) bands at 2.4 GHz and 5.0 GHz (also sometimes referred to as wireless local area network or WLAN bands), the Bluetooth® band at 2.4 GHz, and the global positioning system (GPS) band at 1575 MHz.

Device 10 can cover these communications bands and other suitable communications bands with proper configuration of the antenna structures in the wireless communications circuitry. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands.

Device 10 may include storage and processing circuitry such as storage and processing circuitry 16. Storage and processing circuitry 16 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 16 may be used in controlling the operation of device 10. Processing circuitry in circuitry 16 may be based on processors such as microprocessors, microcontrollers, digital signal processors, dedicated processing circuits, power management circuits, audio and video chips, radio-frequency transceiver processing circuits, radio-frequency integrated circuits of the type that are sometimes referred to as baseband modules, and other suitable integrated circuits.

Storage and processing circuitry 16 may be used in implementing suitable communications protocols. Communications protocols that may be implemented using storage and processing circuitry 16 include internet protocols, wireless local area network protocols (e.g., IEEE 802.11 protocols—sometimes referred to as Wi-Fi®), protocols for other short-range wireless communications links such as the Bluetooth® protocol, protocols for handling 2G cellular telephone communications services, 3G communications protocols, 4G communications protocols, etc.

Data signals that are to be transmitted by device 10 may be provided to baseband module 18. Baseband module 18 may be implemented using a single integrated circuit (e.g., a baseband processor integrated circuit) or using multiple integrated circuits.

Baseband processor 18 may receive signals to be transmitted over antenna 34 over path 13 from storage and processing circuitry 16. Baseband processor 18 may provide signals that are to be transmitted to transmitter circuitry within RF transceiver circuitry 14. The transmitter circuitry may be coupled to radio-frequency power amplifier circuitry 20 via transmit path 26. Path 13 may also carry control signals from storage and processing circuitry 16. These control signals may be used to control the power of the radio-frequency signals that the transmitter circuitry within transceiver circuitry 14 supplies to the input of power amplifiers 20 via path 26. This transmitted radio-frequency signal power level is sometimes referred to herein as Pin, because it represents the input power to power amplifier circuitry 20.

During data transmission, power amplifier circuitry 20 may boost the output power of transmitted signals to a sufficiently high level to ensure adequate signal transmission. Circuitry 28 may contain a radio-frequency duplexer and other radio-frequency output stage circuitry such as radio-frequency switches and passive elements. Switches may, if desired, be used to switch the wireless circuitry between a transmitting mode and a receiving mode. Duplex filter 28 may be used to route input and output signals based on their frequency.

Matching circuitry 32 may include a network of passive components such as resistors, inductors, and capacitors and ensures that antenna structures 34 are impedance matched to the rest of the wireless circuitry. Wireless signals that are received by antenna structures 34 may be passed to receiver circuitry in transceiver circuitry 14 over a receive path such as path 36.

Each radio-frequency power amplifier (e.g., each power amplifier in power amplifier circuitry 20) may include one or more power amplifier stages such as stages 22. As an example, each power amplifier may be used to handle a separate communications band and each such power amplifier may have three series-connected power amplifier stages 22. Stages 22 may have power supply terminals such as terminals 24 that receive bias voltages. Bias voltage may be supplied to terminals 24 using path 42. Control signals from storage and processing circuitry 16 may be used to selectively enable and disable stages 22 using control path 44.

By enabling and disabling stages 22 selectively, the power amplifier may be placed into different gain modes. For example, the power amplifier may be placed into a high gain mode by enabling all three of power amplifier stages 22 or may be placed into a low gain mode by enabling two of the power amplifier stages. Other configurations may be used if desired. For example, a very low gain mode may be supported by turning on only one of three gain stages or arrangements with more than three gain mode settings may be provided by selectively enabling other combinations of gain stages (e.g., in power amplifiers with three or more than three gains stages).

Device 10 may include adjustable power supply circuitry such as power supply circuitry 38. Adjustable power supply circuitry 38 may be controlled by control signals received over control path 40. The control signals may be provided to adjustable power supply circuitry 38 from storage and processing circuitry 16 or any other suitable control circuitry (e.g., circuitry implemented in baseband module 18, circuitry in transceiver circuits 14, etc.).

Storage and processing circuitry 16 may maintain a table of control settings or other stored information to be used in controlling power supply circuitry 38. The table may include a list of bias voltages (Vcc values) that are to be supplied by adjustable power supply circuitry 38. Based on the known operating conditions of circuitry 44 such as its current transmission mode (a high gain mode or a low gain mode), the desired output power value Pout to be produced by power amplifier circuitry 20 (e.g., the output power from amplifier 20 as measured at output 30 of duplex filter 28), the desired transmit frequency, and based on the values of the control settings in the table, storage and processing circuitry 16 may generate appropriate control signals on path 40 (e.g., analog control voltages or digital control signals).

The control signals that are supplied by circuitry 16 on path 40 may be used to adjust the magnitude of the positive power supply voltage Vcc (sometimes referred to as the amplifier bias) that is provided to power amplifier circuitry 20 and terminal 42 over path 42. These power supply voltage adjustments may be made during testing and during normal operation of device 10.

Figure 2:
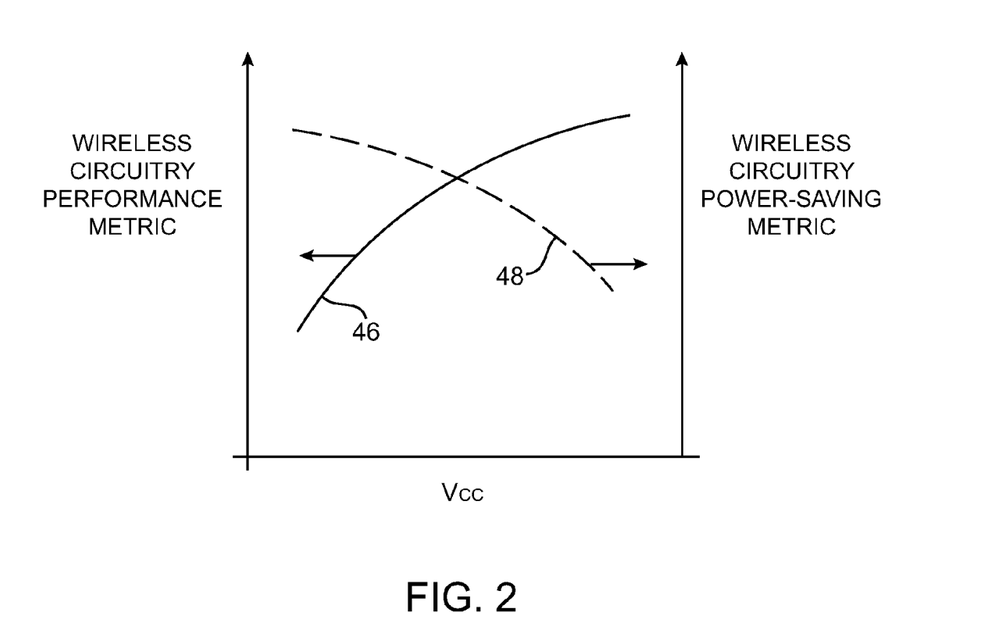
FIG. 2 is a graph showing how wireless circuitry performance and power saving metrics may vary with supply voltage in accordance with an embodiment of the present invention.

Wireless communications circuitry in device 10 may be characterized by metrics such as a wireless circuitry performance metric and a wireless circuitry power savings metric. The values of these metrics may vary as a function of supply voltage (e.g., the supply voltage Vcc that is fed to the power amplifier circuitry), as shown in FIG. 2. Increasing supply voltage Vcc may increase a wireless circuitry performance metric (e.g., by improving ACLR), as indicated by curve 46. Increasing supply voltage Vcc may, however, decrease the wireless circuitry power saving metric (e.g., by consuming more power), as indicated by dotted curve 48. In this scenario, an optimum supply voltage for use during normal operation may exist that takes both metrics into account (e.g., an optimum supply voltage may exist that provides desirable levels for both metrics).

The performance of radio-frequency power amplifier circuitry 20 may, for example, be characterized by a performance metric such as an adjacent channel leakage ratio (ACLR). Power amplifier circuitry 20 may be used to transmit wireless signals in a desired radio channel. The adjacent channel leakage ratio is the ratio of out-of-channel power (e.g., an output power level of signals at frequencies outside of the desired radio channel) to in-channel power (e.g., an output power level of signals within the desired radio channel).

The adjacent channel leakage ratio may be expressed in terms of decibels relative to carrier (in-channel) signals (dBc). The adjacent channel leakage ratio expressed using dBc may be calculated by evaluating ten multiplied by the base-ten logarithm of the ratio of the relevant power levels. For example, consider a scenario in which the out-of-channel power level is 10 uW and the in-channel carrier power level is 100 mW. The adjacent channel leakage ratio is therefore −40 dBc ($10*\log_{10}(0.01 \div 100)$).

Consider another scenario in which the out-of-channel power level is 1 uW and the in-channel carrier power level is 100 mW. The adjacent channel leakage ratio in this situation is −50 dBc ($10*\log_{10}(0.001 \div 100)$).

It is desirable to have good out-of-channel rejection (i.e., a small adjacent channel leakage ratio). It may therefore be desirable to obtain a more negative adjacent channel leakage ratio when expressed in terms of dBc, because taking the logarithm of a smaller ratio produces a more negative result.

An ACLR margin value may be calculated based on the adjacent channel leakage ratio. ACLR margin may be defined as a target adjacent channel leakage ratio minus a measured adjacent channel leakage ratio, as shown in equation 1.

$$\text{ACLR Margin} = \text{ACLR}_{TARG} - \text{ACLR}_{MEAS} \quad (1)$$

The target ACLR is set according to design criteria (e.g., a design specification). The target ACLR may, for example, be −40 dB. In the scenario above in which the measured ACLR is −40 dBc, the ACLR margin is zero (−40 minus −40). In the scenario above in which the measured ACLR is −50 dBc, the ACLR margin is 10 dB (−40 minus −50). In general, a higher or more positive ACLR margin is more desirable.

Figure 3:
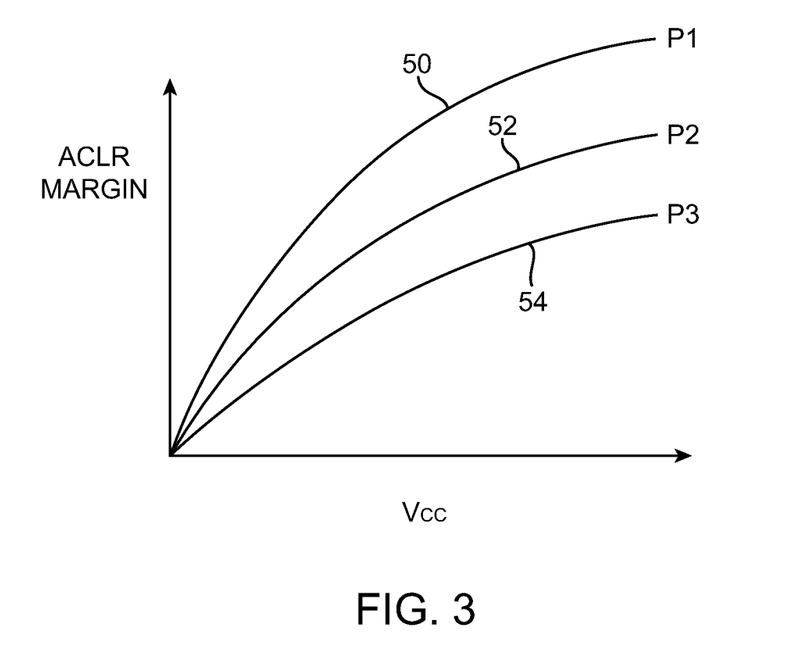
FIG. 3 is a plot illustrating how the adjacent channel leakage ratio (ACLR) of radio-frequency power amplifier circuitry may vary with supply voltage in accordance with an embodiment of the present invention.

In general, ACLR margin increases with supply voltage Vcc, as shown in FIG. 3. Curves 50, 52, and 54 of FIG. 3 represent ACLR margin characteristics for power amplifier circuitry 20 of FIG. 1 operating at respective output power levels of P1, P2, and P3. The output power levels may be expressed in terms of dBm (power relative to 1 mW in units of decibels). For example, power levels P1, P2, and P3 may be 10 dBm, 14 dBm, and 20 dBm, respectively.

Curves 50, 52, and 54 may characterize power amplifier circuitry 20 when operating in a given gain mode (e.g., a low gain mode or a high gain mode). In general, when circuitry 20 is transmitting signals at higher power levels at a fixed gain mode, circuitry 20 will experience more strain and therefore exhibit degraded linearity or lower ACLR margin. As a result, curve 52 may have lower ACLR margin values at each supply voltage level in comparison to curve 50. Similarly, curve 54 may exhibit lower ACLR margin at each voltage Vcc in comparison to curve 52.

Figure 4:
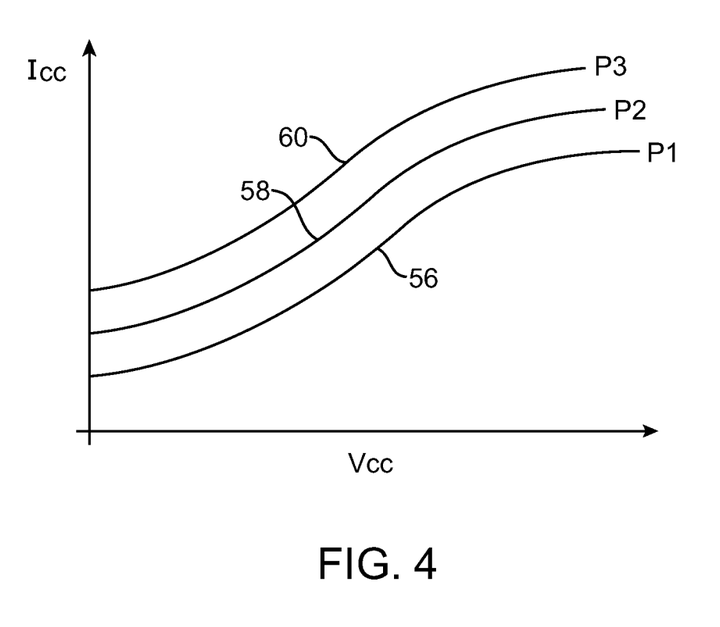
FIG. 4 is a graph illustrating how supply current flowing through radio-frequency power amplifier circuitry may vary with supply voltage in accordance with an embodiment of the present invention.

Power supply circuitry 38 may supply current Icc to power amplifier circuitry 20 over path 42 (see, e.g., FIG. 1). Supply current Icc increases with supply voltage Vcc, as shown in FIG. 4. Curves 56, 58, and 60 represent characteristics curves for power amplifier circuitry 20 of FIG. 1 operating at respective output power levels of P1, P2, and P3. Power levels P1, P2, and P3 may be 12 dBm, 16 dBm, and 24 dBm (as examples).

Curves 56, 58, and 60 may represent power amplifier circuitry 20 operating in a particular gain mode. Circuitry 20 that is transmitting signals at higher power levels at a fixed gain mode will consume more current. As a result, curve 56 may exhibit lower supply current values at each supply voltage level in comparison to curve 58. Similarly, curve 58 may have lower supply current levels at each voltage Vcc in comparison to curve 60. It would be desirable to bias circuitry 20 at lower supply voltage levels if power consumption were a primary concern, because a lower supply voltage consumes less current and therefore less power.

From a performance perspective, it is desirable to operate the power amplifier circuitry at higher supply voltages (see, e.g., FIG. 3). From a power savings perspective, it is desirable to operate the power amplifier circuitry at lower supply voltages (see, e.g., FIG. 4). During device characterization, an optimum supply voltage for biasing the power amplifier circuitry can be determined. The optimum supply voltage takes both metrics (e.g., ACLR margin and supply current Icc) into account.

A combined metric may be calculated from these two metrics. The combined metric may be referred to as a cost function. The cost function may be calculated by taking the product of the ACLR margin raised to a power k and a current savings ratio raised to a power j, as shown in equation 2.

$$\text{Cost Function} = (\text{ACLR Margin})^k * [(I_{MEAS} - I_{MAX})/I_{MAX}]^j \qquad (2)$$

The first product term (ACLR Margin raised to the $k^{th}$ power) may represent the power performance metric while the second product term (the current savings ratio raised to the $j^{th}$ power) may represent the power saving metric. The current savings ratio is determined by subtracting a maximum supply current $I_{MAX}$ from a measured current $I_{MEAS}$ and then dividing that difference by the maximum supply current. Currents $I_{MEAS}$ and $I_{MAX}$ represent currents that are fed to circuitry 20 over path 42 (FIG. 1).

For example, current $I_{MAX}$ represents the maximum current that is fed to the power amplifier circuitry operating at a maximum supply voltage (e.g., maximum Vcc). Current $I_{MEAS}$ represents the actual measured current that flows through the power amplifier circuitry biased at a given supply voltage that is lower than the maximum supply voltage. The current savings ratio has a negative value, because subtracting the maximum supply current from the measured current will yield a negative value. Exponents k and j have values such as 1, 2, more than 2, less than 2, etc.

As described in connection with FIG. 3, a higher (i.e., more positive) ACLR margin is more desirable. According to equation 2, a more negative current savings ratio is more desirable, because reducing current $I_{MEAS}$ lowers power consumption. Because the cost function is defined as the product of the ACLR margin and the current savings ratio, a more negative cost function may be desirable. In scenarios in which the measured ACLR is greater than the target ACLR, ACLR margin would be negative, resulting in an overall positive cost function. A positive cost function is generally undesirable, because it indicates that the power amplifier circuitry is exhibiting an adjacent channel leakage ratio that does not meet design criteria.

Values may be selected for exponents k and j that place more weight (emphasis) on one of the metrics than the other. For example, in design RF power amplifier circuitry that requires more linearity, exponent k may be set to two and exponent j may be set to one to put more emphasis on ACLR margin. When designing power amplifier circuitry that requires low power consumption, exponent j may be set to three and exponent k may be set to one (as an example). Exponents j and k may have other values to implement other suitable weighting schemes, if desired.

Figure 5:
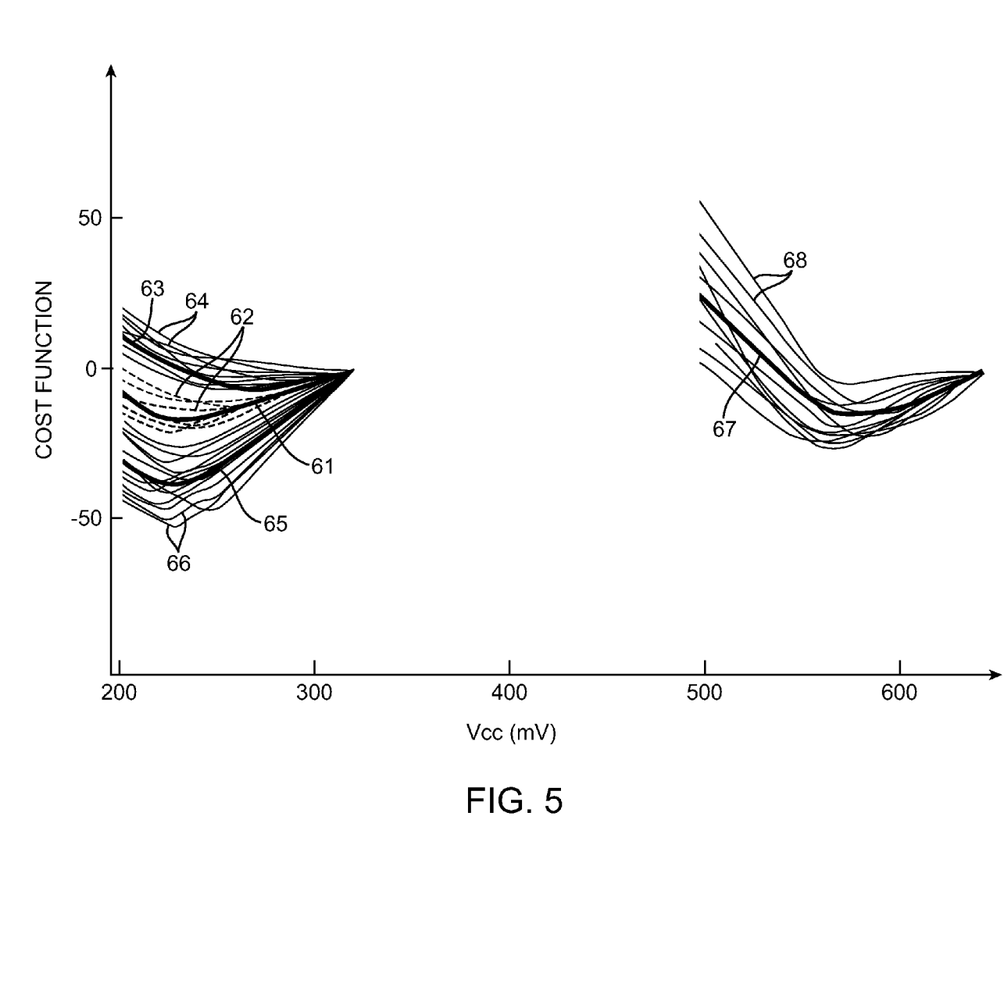
FIG. 5 is a plot illustrating cost function characteristics for radio-frequency power amplifier circuitry at various operating conditions in accordance with an embodiment of the present invention.

FIG. 5 plots the cost function (see, e.g., equation 2) versus supply voltage Vcc for the power amplifier circuitry at various operating conditions. For example, curves 62 and 64 may represent cost function characteristic curves for the power amplifier circuitry operating in the low gain mode with output power levels of 10 dBm and 12 dBm, respectively.

Curves 62 and 64 may be measured at a relatively low supply voltage range (e.g., 200 mV to 320 mV), because the output power level of 10 dBm and 12 dBm can be achieved at relatively low supply voltages levels. Curves 64 may have relatively worse (i.e., higher) cost function levels than curves 62, because outputting signals at a higher power level in the low gain mode places the power amplifier circuitry under more strain, thus degrading ACLR and increasing the cost function. The ACLR of curves 64 may be degraded so that ACLR margin becomes positive, resulting in positive cost function levels. In contrast, curves 62 may exhibit negative cost function values, indicating that the measured ACLR is at least below the target ACLR.

Curves 66 may represent cost function characteristics for the power amplifier circuitry operating in the high gain mode with an output power level of 14 dBm. Curves 66 may be measured at the low supply voltage range (e.g., 200 mV to 320 mV). Curves 66 may exhibit relatively better (i.e., more negative) cost function levels than curves 64, because curves 66 is obtained in the high gain mode instead of the low gain mode used to obtain curves 64. Even though curves 66 represent a higher output level of 14 dBm in comparison to curves 64, the power amplifier circuitry operating in the high gain mode places the individual power amplifier stages under less strain, resulting in improved ACLR margin or a more negative cost function (see, e.g., FIG. 5).

Curves 68 may represent cost function characteristic curves for the power amplifier circuitry operating in the high gain mode with an output power level of 24 dBm (as an example). Curves 68 may be measured at a relatively higher supply voltage range (e.g., 500 mV to 650 mV), because the output power level of 24 dBm may be achieved at relatively higher supply voltages. Portions of curves 68 exhibit positive cost function levels, indicating that the power amplifier circuitry is placed under sufficient strain.

Each respective curve in each set of characteristic curves may represent a different power amplifier circuitry characteristic measured from a respective electronic device under test (DUT) that is tested under a particular transmit setting (e.g., each DUT is tested while operating under a same output power level, frequency, etc.). Each respective curve measured from each DUT varies from one another due to random process variations. For example, a hundred DUTs may be tested individually to obtain a hundred corresponding curves. The measured curves for each set of transmit settings may be averaged to compute an average cost function characteristic curve. For example, highlighted curve 61 represents the computed average cost function curve for curves 62, highlighted curve 63 represents the computed average cost function curve for curves 64, highlighted curve 65 represents the computed average cost function curve for curves 66, and highlighted curve 67 represents the computed average cost function curve for curves 68. The optimized settings loaded into device 10 may be calculated based on the average cost function curves. Optimized settings determined in this way may therefore be referred to as cost-function-derived optimized settings.

During device characterization operations, a set of characteristic curves (e.g., curves 62, 64, 66, 68, etc.) may be obtained for power amplifier circuitry in a variety of operating conditions. Characteristic curves may be measured when devices are operating in different gain modes, at different supply voltage levels, at different frequency ranges (e.g., different radio channels), at different output power levels, etc. These characteristic curves are often U-shaped curves that have a minimum point (e.g., a point corresponding to the most negative cost function value). This minimum point may represent an operating point that provides a desired balance between ACLR margin and power saving. During normal operation, it may be desirable to bias the power amplifier circuitry with an optimum voltage supply level that corresponds to the minimum point of the average cost function curve to obtain the minimum cost function. This type of statistical analysis may provide each device with cost-function-derived optimized settings that take into account both amplifier performance and power savings. With one suitable arrangement, each device that is produced may be provided with information (e.g., a stored table) that allows that device to operate at the optimum level during use by a user.

Figure 6:
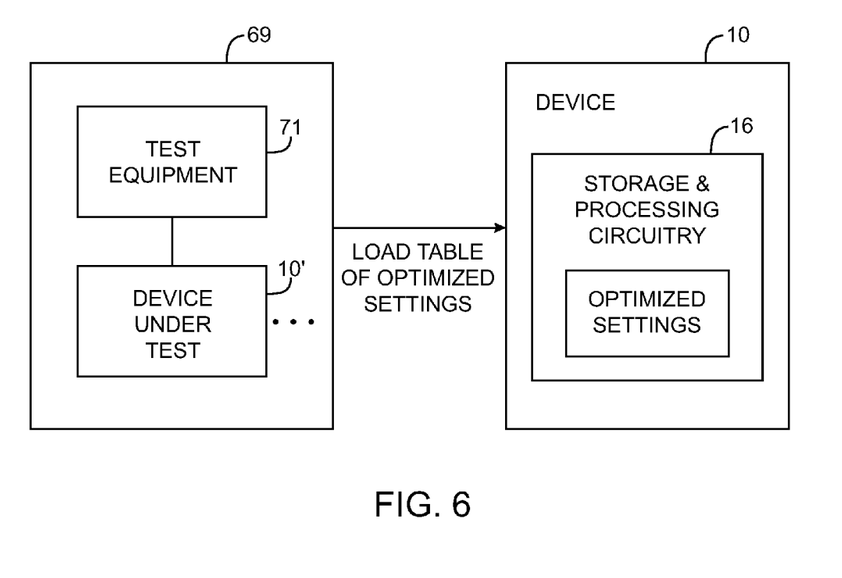
FIG. 6 is a diagram showing how multiple devices may be tested to obtain a table of optimized settings in accordance with an embodiment of the present invention.

In test system 69, device under test (DUT) 10' may be connected to test equipment 71 during device characterization, as shown in FIG. 6. Multiple DUTs 10' may be tested under each operating setting (e.g., in each gain mode, at each supply voltage level, at each frequency setting, at each output power levels, etc.) to obtain different sets of characteristic cost function curves. A hundred, a thousand, or any desired number of devices may be tested for each operating setting (as an example).

An average cost function curve may be determined for each set of curves. The amplifier bias voltage that corresponds to the minimum point of each average cost function curve may be stored in a table of optimized settings. For example, the table of cost-function-derived optimized settings may include an optimum supply voltage Vcc (i.e., a bias voltage level that is used to bias the power amplifier circuitry) that is optimized for a device operating in high gain mode at 12 dBm output power level at 900 MHz.

During manufacturing processes, the table of optimized settings may be loaded onto device 10. The optimized settings may be stored on storage and processing circuitry 16, as shown in FIG. 6. Device 10 may be used by a user to provide wireless communications in a wireless network.

Figure 7:
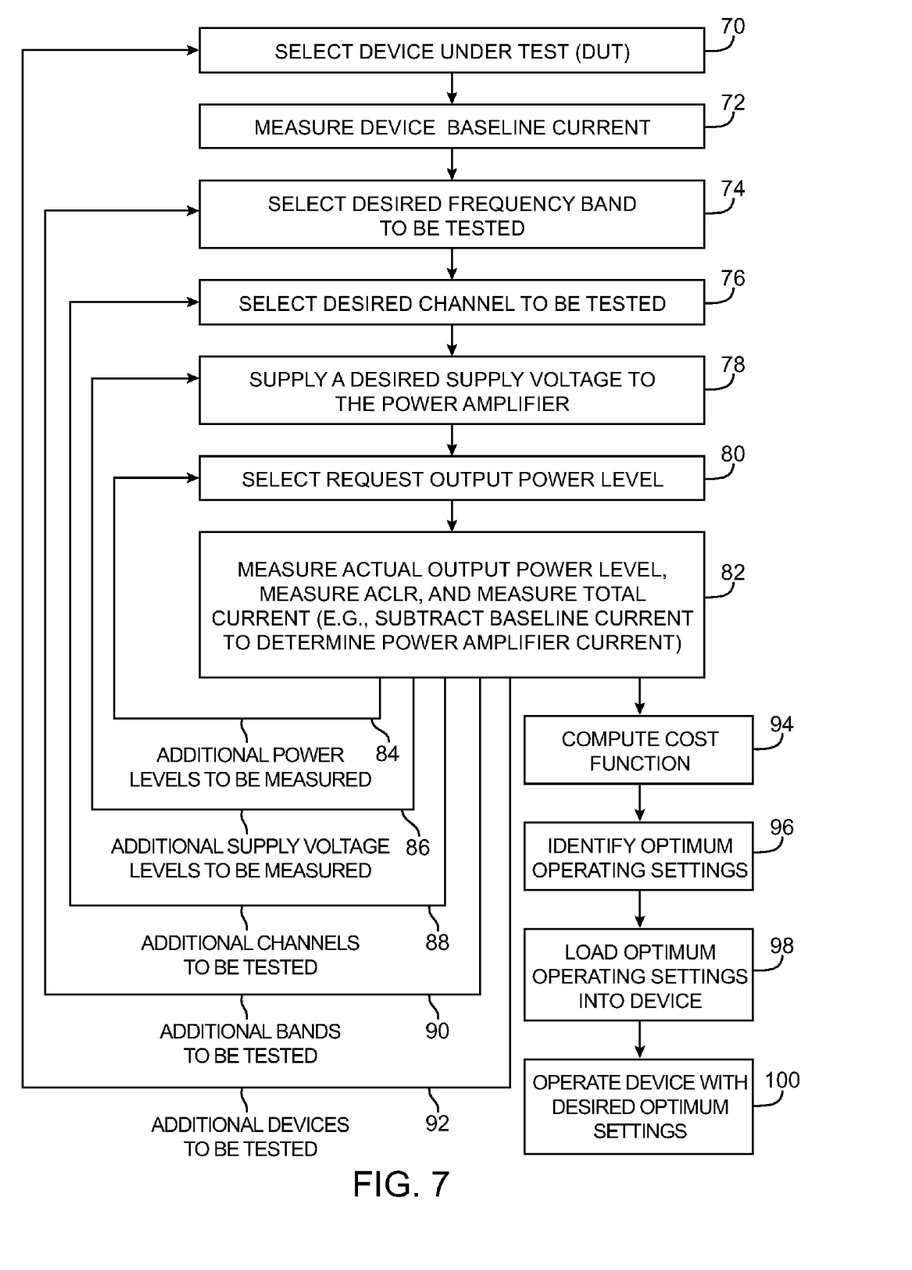
FIG. 7 is a flow chart of illustrative steps involved in determining optimum supply voltage settings for biasing radio-frequency power amplifier circuitry in accordance with an embodiment of the present invention.

FIG. 7 shows steps involved in testing an illustrative electronic device with power amplifier circuitry. At step 70, a user may select a given electronic device to be a device under test (DUT). A device baseline current may be measured (step 72). The baseline current may be the total current supplied to the device under test when the power amplifier circuitry is inactive (e.g., turned off or unpowered).

At step 74, test equipment (e.g., test equipment 71 as shown in FIG. 6) that is connected to the device may direct the CUT to operate in a specific frequency band (step 74). The test equipment may further direct the device to be tuned to a desired radio channel for testing (step 76).

At step 78, the test equipment may direct the power supply circuitry to supply the power amplifier circuitry with a desired supply voltage. The test equipment may then direct the power amplifier circuitry to output signals at a requested output power level (step 80).

At step 82, the test equipment may measure the actual output power level, the ACLR, and the total current flowing through the DUT. The baseline current may be subtracted from the total current to determine the supply current Icc flowing through the power amplifier circuitry.

Obtaining the output power level, ACLR, and current Icc in this way produces a data point for the cost function plot. Processing may loop back to step 80 to measure additional output power levels, as indicated by path 84. Processing may loop back to step 78 to measure additional supply voltage levels, as indicated by path 86. Processing may loop back to step 76 to test additional radio channels, as indicated by path 88. Processing may loop back to step 74 to test additional frequency bands, as indicated by path 90. Processing may loop back to step 70 if it is desired to test additional devices, as indicated by path 92.

Once sufficient data is collected, cost functions corresponding to the DUTs that have been measured may be computed (step 94). At step 96, optimum control settings may be identified by locating the minimum point on each cost function characteristic curve. During manufacturing, each minimum point corresponding to respective operating conditions may be loaded onto a device (step 98). For example, a table of cost-function-derived optimized settings may be loaded onto each device. The table of optimized settings may include optimum power amplifier circuitry bias voltage levels that correspond to each operating condition (e.g., in each gain mode, at each supply voltage level, at each frequency setting, at each output power levels, etc.).

At step 100, a device that has been provided with these optimized settings may operate in accordance with the optimum control settings (e.g., by selecting the optimal supply voltage to bias the power amplifier circuitry) depending on the operating conditions of the device.

The foregoing is merely illustrative of the principles of this invention and various modifications can be made by those skilled in the art without departing from the scope and spirit of the invention.

What is claimed is:

1. A method of testing a plurality of wireless electronic devices having storage and processing circuitry and power amplifier circuitry, comprising:
   with the storage and processing circuitry of each wireless electronic device, configuring that wireless electronic device to operate under a given operating condition;
   with test equipment, measuring a performance metric of the power amplifier circuitry for each wireless electronic device while that wireless electronic device is operating under the given operating condition;
   with the test equipment, measuring a power savings metric of the power amplifier circuitry for each wireless electronic device while that wireless electronic device is operating under the given operating condition;
   with the test equipment, computing a cost function value for each wireless electronic device by taking a product of the performance metric and the power savings metric for that wireless electronic device; and
   with the test equipment, obtaining an optimum operating setting for the power amplifier circuitry based on the measured performance metric and the measured power savings metric.

2. The method defined in claim 1, wherein configuring each wireless electronic device to operate under the given operating condition comprises:
   configuring that wireless electronic device to transmit wireless signals with the power amplifier circuitry at a common output power level using a given gain mode.

3. The method defined in claim 2, wherein measuring the performance metric of the power amplifier circuitry comprises measuring an adjacent channel leakage ratio.

4. The method defined in claim 3, wherein measuring the power savings metric of the power amplifier circuitry for each wireless electronic device comprises:
   measuring a baseline current for that wireless electronic device while the power amplifier circuitry for that wireless electronic device is turned off; and
   measuring a total supply current for that wireless electronic device while the power amplifier circuitry for that wireless electronic device is turned on.

5. The method defined in claim 4, wherein computing the cost function further comprises:
   raising the adjacent channel leakage ratio to a first exponent value to obtain the performance metric;
   computing a current savings ratio based on the baseline current and the total supply current; and
   raising the current savings ratio to a second exponent value to obtain the power savings metric.

6. The method defined in claim 5, further comprising:
with the test equipment, computing an average cost function characteristic curve based on the cost function values measured from the plurality of wireless electronic devices.

7. The method defined in claim 6, further comprising:
with the test equipment, determining an optimum power amplifier bias voltage level that corresponds to a minimum point on the average cost function characteristic curve.

8. The method defined in claim 7, further comprising:
with the test equipment, storing the optimum power amplifier bias voltage level in a table of cost-function-derived optimized settings.

9. The method defined in claim 8, further comprising:
with the test equipment, obtaining additional optimum power amplifier bias voltage levels by testing each of the wireless electronic devices at additional output power levels; and
with the test equipment, storing the additional optimum power amplifier bias voltage levels in the table of cost-function-derived optimized settings.

10. The method defined in claim 1, wherein measuring the performance metric of the power amplifier circuitry comprises measuring a radio-frequency linearity metric, and wherein measuring the power savings metric comprises measuring a current-based metric.

11. A method of testing at least one electronic device having radio-frequency power amplifier circuitry, comprising:
with test equipment that is separate from the electronic device, measuring a performance metric of the radio-frequency power amplifier circuitry;
with the test equipment, measuring a power savings metric of the radio-frequency power amplifier circuitry; and
with the test equipment, obtaining an optimum operating setting for the radio-frequency power amplifier based on a cost function value that is a function of the measured performance metric and the measured power savings metric.

12. The method defined in claim 11, wherein measuring the performance metric of the radio-frequency power amplifier circuitry comprises measuring a radio-frequency linearity metric for the radio-frequency power amplifier circuitry.

13. The method defined in claim 11, wherein measuring the performance metric of the radio-frequency power amplifier circuitry comprises measuring an adjacent channel leakage ratio.

14. The method defined in claim 11, wherein measuring the power savings metric of the radio-frequency power amplifier circuitry comprises measuring a current-based metric.

15. The method defined in claim 11, wherein measuring the power savings metric of the radio-frequency power amplifier circuitry comprises:
measuring a baseline current for the electronic device while the radio-frequency power amplifier circuitry is turned off; and
measuring a total current for the electronic device while the radio-frequency power amplifier circuitry is turned on.

16. The method defined in claim 15, wherein measuring the power savings metric of the radio-frequency power amplifier circuitry further comprises:
computing a difference between the baseline current and the total current.

17. The method defined in claim 16, wherein measuring the power savings metric of the radio-frequency power amplifier circuitry further comprises:
computing a current savings ratio based on the computed difference and a maximum supply current of the electronic device.

18. The method defined in claim 11, wherein obtaining the optimum operating setting comprises determining an optimum bias voltage level for the radio-frequency power amplifier circuitry.

19. A method of testing at least one electronic device having radio-frequency power amplifier circuitry, comprising:
with test equipment, measuring a performance metric of the radio-frequency power amplifier circuitry;
with the test equipment, measuring a power savings metric of the radio-frequency power amplifier circuitry;
with the test equipment, obtaining an optimum operating setting for the radio-frequency power amplifier based on the measured performance metric and the measured power savings metric;
computing a first term by applying a first weighting factor to the measured performance metric; and
computing a second term by applying a second weighting factor to the measured power savings metric.

20. The method defined in claim 19, wherein applying the first weighting factor to the measured performance metric comprises raising the measured performance metric to a first exponent value, and wherein applying the second weighting factor to the measured power savings metric comprises raising the measured power savings metric to a second exponent value that is different than the first exponent value.

21. The method defined in claim 19, further comprising:
computing a cost function value corresponding to a given operating condition for the electronic device by computing a product of the first and second terms.

22. The method defined in claim 21, further comprising:
determining whether the radio-frequency power amplifier circuitry operating at the given operating condition satisfies performance criteria by determining whether the computed cost function value is positive or negative.

23. The method defined in claim 21, further comprising:
with the test equipment, configuring the electronic device to operate at the given operating condition by configuring the electronic device to operate at a selected gain mode in a plurality of gain modes, at a selected wireless output power level, and at a selected radio-frequency channel.

* * * * *